United States Patent
Hsu et al.

(10) Patent No.: US 6,703,655 B2
(45) Date of Patent: Mar. 9, 2004

(54) FERROELECTRIC MEMORY TRANSISTOR

(75) Inventors: Sheng Teng Hsu, Camas, WA (US); Fengyan Zhang, Vancouver, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/385,038

(22) Filed: Mar. 10, 2003

(65) Prior Publication Data

US 2003/0222291 A1 Dec. 4, 2003

Related U.S. Application Data

(62) Division of application No. 10/164,785, filed on Jun. 4, 2002, now Pat. No. 6,531,325.

(51) Int. Cl.[7] .......... H01L 29/76; H01L 29/94; H01L 23/48; H01L 21/00; H01L 21/8242
(52) U.S. Cl. .......... 257/295; 257/310; 257/369; 257/774; 438/3; 438/240
(58) Field of Search .......... 257/295, 296, 257/288, 306, 310, 368, 369, 774, 762; 438/254, 353, 396, 398, 3, 240, 255

(56) References Cited

U.S. PATENT DOCUMENTS

| | | | | |
|---|---|---|---|---|
| 4,889,829 A | * | 12/1989 | Kawai | 438/405 |
| 5,144,390 A | * | 9/1992 | Matloubian | 257/347 |
| 5,293,510 A | * | 3/1994 | Takenaka | 257/295 |
| 5,384,729 A | * | 1/1995 | Sameshima | 365/145 |
| 5,499,207 A | * | 3/1996 | Miki et al. | 365/149 |
| 5,731,608 A | * | 3/1998 | Hsu et al. | 257/295 |
| 5,907,762 A | * | 5/1999 | Evans et al. | 438/3 |
| 6,197,668 B1 | * | 3/2001 | Gardner et al. | 438/585 |
| 6,335,550 B1 | * | 1/2002 | Miyoshi et al. | 438/3 |
| 6,602,720 B2 | * | 8/2003 | Hsu et al. | 438/3 |

* cited by examiner

Primary Examiner—Caridad Everhart
Assistant Examiner—Chuong A Luu
(74) Attorney, Agent, or Firm—David C. Ripma; Matthew D. Rabdau

(57) ABSTRACT

A ferroelectric memory transistor includes a substrate having active regions therein; a gate stack, including: a high-k insulator element, including a high-k cup and a high-k cap; a ferroelectric element, wherein said ferroelectric element is encapsulated within said high-k insulator element; and a top electrode located on a top portion of said high-k insulator; a passivation oxide layer located over the substrate and gate stack; and metalizations to form contacts to the active regions and the gate stack. A method of forming a ferroelectric memory transistor includes preparing a substrate, including forming active regions and an oxide device isolation region; forming a gate placeholder structure in a gate region; removing the gate placeholder structure forming a gate void in the gate region; depositing a high-k insulator layer over the structure and in the gate void to from a high-k cup; filling the high-k cup with a ferroelectric material to form a ferroelectric element; depositing a high-k upper insulator layer and removing excess high-k material to form a high-k cap over the ferroelectric element; depositing a top electrode over the high-k cap to form a gate electrode and gate stack; depositing a layer of passivation oxide over the structure; etching the passivation oxide to from contact vias to the active regions and the gate stack; and metallizing the structure to complete the ferroelectric memory transistor.

6 Claims, 3 Drawing Sheets

FERROELECTRIC MEMORY TRANSISTOR

CROSS REFERENCE TO RELATED APPLICATIONS

This application is a divisional of application Ser. No. 10/164,785, filed Jun. 4, 2002, entitled "Memory Transistor and Method of Fabricating Same," invented by Sheng Teng Hsu et al., now U.S. Letters Patent No. 6,531,325.

RELATED APPLICATION

This application is related to MFOS memory transistor and method of fabricating same, invented by Hsu et al., Ser. No. 09/820,039, filed Mar. 28, 2001, now U.S. Letters Patent No. 6,531,324.

FIELD OF THE INVENTION

This invention relates to the fabrication of a long-memory-retention-time single transistor ferroelectric RAM, and specifically to a ferroelectric RAM having a ferroelectric element which is encapsulated in a high-k dielectric.

BACKGROUND OF THE INVENTION

Prior art single transistor metal-ferroelectric-oxide semiconductor (MFOS) gate stacks include a top electrode, a ferroelectric layer and an oxide layer. After such a device is programmed, electrons, or holes, may flow from the top electrode into and become trapped in the ferroelectric layer. The polarity of the trapped charge is opposite to that of the polarization charges. Therefore, these trapped charges cause the reduction of the memory window.

SUMMARY OF THE INVENTION

A ferroelectric memory transistor includes a substrate having active regions therein; a gate stack, including: a high-k insulator element, including a high-k cup and a high-k cap; a ferroelectric element, wherein said ferroelectric element is encapsulated within said high-k insulator element; and a top electrode located on a top portion of said high-k insulator; a passivation oxide layer located over the substrate and gate stack; and metalizations to form contacts to the active regions and the gate stack.

A method of forming a ferroelectric memory transistor includes preparing a substrate, including forming active regions and an oxide device isolation region; depositing a gate oxide layer; depositing a gate placeholder layer; masking and removing a portion of the gate placeholder layer and the gate oxide layer to form a gate placeholder structure in a gate region; depositing a layer of oxide over the structure to a depth of approximately twice that of the gate placeholder layer; smoothing the structure to the level of the gate placeholder layer; removing the gate placeholder structure and the gate oxide layer in the gate region, forming a gate void in the gate region; depositing a high-k insulator layer over the structure and in the gate void to from a high-k cup; filling the high-k cup with a ferroelectric material to form a ferroelectric element; smoothing the structure to the upper level of the ferroelectric element; depositing a high-k upper insulator layer and removing excess high-k material to form a high-k cap over the ferroelectric element; depositing a top electrode over the high-k cap to form a gate electrode and gate stack; depositing a layer of passivation oxide over the structure; etching the passivation oxide to from contact vias to the active regions and the gate stack; and metallizing the structure to complete the ferroelectric memory transistor.

It is an object of the invention to provide a non-volatile ferroelectric memory device, which eliminates the leakage-related transistor memory retention degradation.

Another object of the invention is to provide a ferroelectric memory cell wherein the ferroelectric element is encapsulated in a high-k dielectric.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
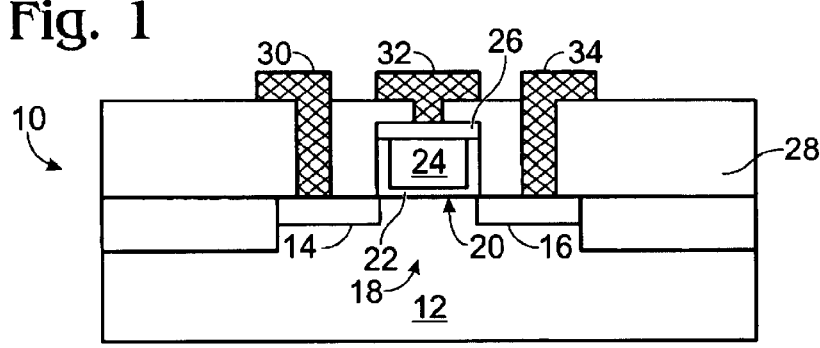
FIG. 1 depicts a prior art FE memory transistor.

A typical state-of-the-art structure of a metal-ferroelectric-oxide semiconductor (MFOS) transistor or metal-ferroelectric-insulator semiconductor (MFIS) transistor is depicted in FIG. 1, generally at 10. Transistor 10 includes a substrate 12, a source 14, a drain 16, and a gate 18. Gate 18 includes a gate stack 20, having a high-k insulator 22, a ferroelectric element 24 and a top electrode 26. High-k insulator 22, in the prior art is located below and around the sides of the ferroelectric element. The structure is covered with a passivation oxide 28, which has vias formed therein for the provision of metal contacts 30, 32 and 34, for, respectively, source 14, gate 18 and drain 16. Gate stack 18 includes a metal-ferroelectric thin film-insulator on a silicon substrate (MFIS). High-k insulator 22 has a high dielectric constant and low leakage current, and may be selected from materials such as $HfO_2$, $ZrO_2$, or $HfZrO_x$. The ferroelectric material is taken from the group consisting of lead germanium oxide ($Pb_5Ge_3O_{11}$) (PGO), $Pb(Zr,Ti)O_3$ (PZT), $Sr Bi_2Ta_2O_9$ (BTO), $SrBa_2Ta_2O_9$ (SBTO), and $SrBi_2(Ta_{1-x}Nb_x)_2O_9$ (SBTN), and the top electrode may be formed of copper, aluminum, iridium or platinum. Such a structure is referred to as a fertoelectric capacitor.

Figure 2:
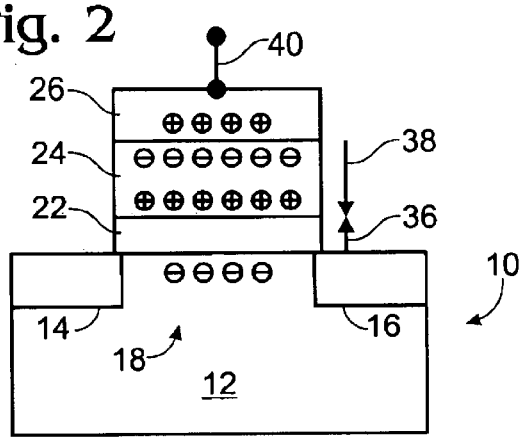
FIG. 2 depicts the charge and field distribution of the transistor of FIG. 1.

FIG. 2 depicts the charge and field distribution during memory retention after the device of FIG. 1 is programmed to the low threshold voltage state and the gate is at the ground potential. Arrow 36 represents the voltage of the high-k dielectric, $V_{Ox}$, arrow 38 represents the voltage of the ferroelectric (FE) element, $V_{FE}$, and 40 represents the voltage at the top of the gate stack, $V_0$. There is a voltage across the insulator as well as across the ferroelectric capacitor. The voltage across the insulator is equal to but of opposite polarity as that of the voltage across the ferroelectric capacitor. The voltage in the ferroelectric capacitor is referred to as the de-polarization voltage.

$$V_{FE} = V_{Ox} = V_{00} \qquad (1)$$

$$V_{OO} = \frac{Q_R}{C_{Ox} + C_{FE}} \quad (2)$$

where $Q_R$ is the charge on the FE capacitor, $C_{ox}$ is the capacitance of the high-k insulator and $C_{FE}$ is the capacitance of the FE element.

Figure 3A:
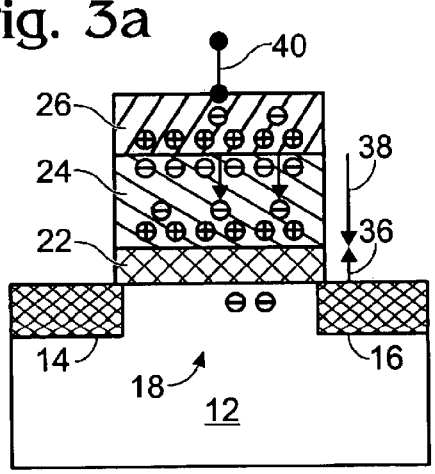
FIG. 3 depicts the charge and field distribution at various states in the transistor of FIG. 1.
Figure 3B:
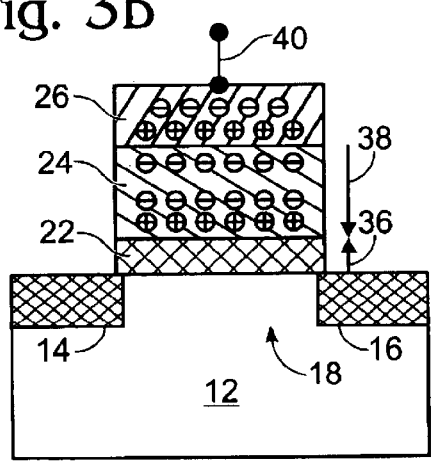

Although it is not possible for holes, or electrons, to flow from insulator 22 into ferroelectric thin film 24, there are a large number of electrons and holes in the electrode 26. Holes may move from top electrode 26 into ferroelectric thin film 24, as shown in FIG. 3a, which is referred to as the leakage current of a metal-ferroelectric-metal (MFM) capacitor. Holes cannot flow through the insulator because of the potential barrier at the insulator and ferroelectric material interface and the opposite polarity of electric field in the insulator, therefor, holes which move into the ferroelectric material will remain trapped therein, as illustrate in FIG. 3b, where $V_{FE}$ and $V_{ox}$ both equal zero. The trapped holes in the ferroelectric material compensate for the polarized electrons in the ferroelectric thin film. This degrades the memory of the device. When the memory transistor is programmed to its high threshold voltage state, the charge and the voltage polarities change, however, the flow of electrons and the trapping mechanisms remain the same.

Figure 4:
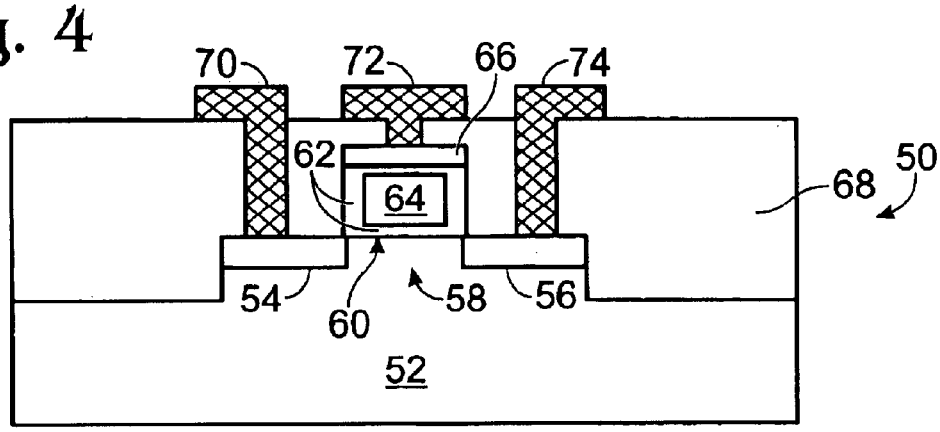
FIG. 4 depicts the memory transistor of the invention.

To eliminate this leakage current related memory retention degradation, an additional insulator is inserted in between the ferroelectric thin film and the top electrode, as depicted in the transistor of FIG. 4, generally at 50. Transistor 50 includes a substrate 52, a source 54, a drain 56, and a gate 58. Gate 58 includes a gate stack 60, having a high-k insulator 62 which encapsulates a ferroelectric element 64, and a top electrode 66. High-k insulator 62 includes a lower portion, 62L, which is located between the FE element and silicon substrate 52, and which encloses the sides of the FE element, and an upper portion, 62U, which is located between FE element 64 and top electrode 66. The structure is covered with a passivation oxide 68, which has vias formed therein for the provision of metal contact 70, 72 and 76, for, respectively, source 54, gate 58 and drain 56. Gate stack 58 includes a metal ferroelectric thin film insulator on a silicon substrate (MFIS). High-k insulator 52 has a high dielectric constant and low leakage current, and may be selected from materials such as $HfO_2$, $ZrO_2$, or $HfZrO_X$. The ferroelectric material is taken from the group consisting of lead germanium oxide ($Pb_5Ge_3O_{11}$) (PGO), $Pb(Zr,Ti)O_3$ (PZT), $SrBi_2Ta_2O_9$ (BTO), $SrBa_2Ta_2O_9$ (SBTO), and $SrBi_2(Ta_{1-x}Nb_x)_2O_9$ (SBTN), and the top electrode may be formed of copper, aluminum, iridium or platinum.

Figure 5:
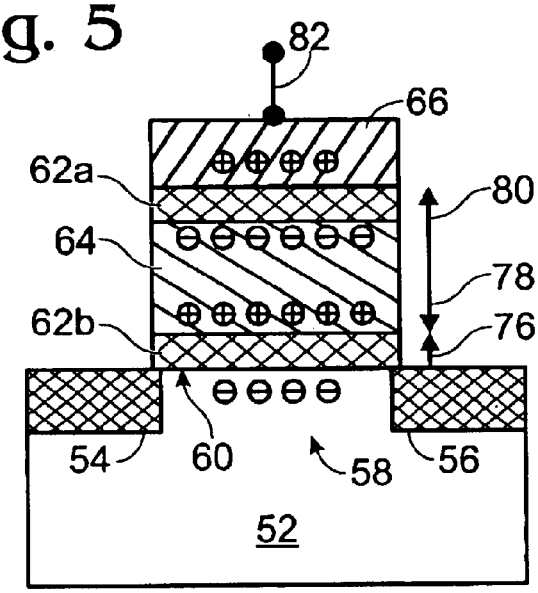
FIG. 5 depicts the charge and field distribution of the transistor of FIG. 4.

FIG. 5 depicts the device condition, i.e., the field polarity and the charge distribution, after programming the device to its low threshold voltage, and after the gate voltage returns to ground potential. The voltage across the ferroelectric thin film 78 ($V_{FE}$) is equal to the sum of voltage across high-k insulators 62L (arrow 76, Vox1) and 62U (arrow 80, $V_{ox2}$). The polarity of the electric field in the ferroelectric is opposite to that in high-k insulators 62L and 62U. The usual leakage current related degradation mechanisms found in the prior art do not exist in this structure because there are no free carriers in the two insulators and because the field distribution current carriers are prevented from flowing into the ferroelectric thin film. Arrow 82 represents the voltage at the top of top electrode 66, V0. The only source of memory degradation in the structure of the invention is due to the de-polarization field.

When the memory transistor of the invention is programmed to its high threshold voltage state, the electric charge and the electric field polarities in both ferroelectric thin film and insulator change directions. There is no leakage-related charge trapping, which may cause memory retention degradation.

Figure 6:
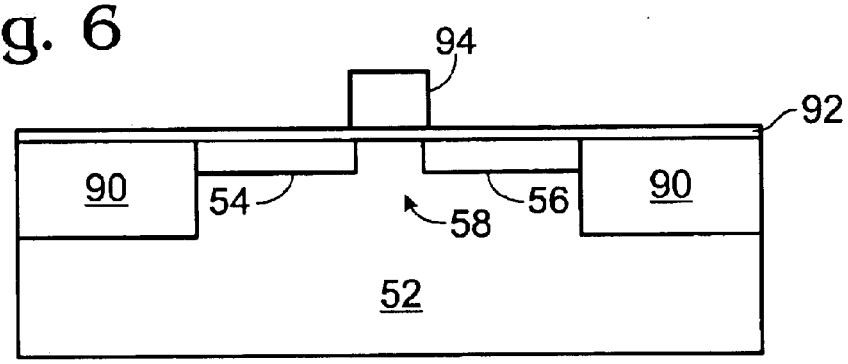
FIGS. 6–10 depict successive steps in the fabrication of the memory transistor of FIG. 4.

The preferred fabrication method of the invention for this device is as follows, and now referring to FIG. 6, substrate 52 is prepared by any state-of-the-art process for substrate preparation, including well ion implantation and shallow trench isolation device isolation. Device isolation includes formation of an oxide isolation region 90, which extends about the periphery of the memory transistor. A sacrificial gate oxide layer 92 is grown to a thickness of between about 2 nm to 5 nm, and a layer of silicon nitride 94 is deposited to a thickness of between about 100 nm to 600 nm. The silicon nitride is masked, and the layer removed except for the gate placeholder in the gate region. Polysilicon may be used in place of the silicon nitride layer. Active regions, source 54 and drain 56 may be prepared by source/drain ion implantation, including LDD, Halo, and N+ or P+ ion implantation if so desired at this time.

Figure 7:
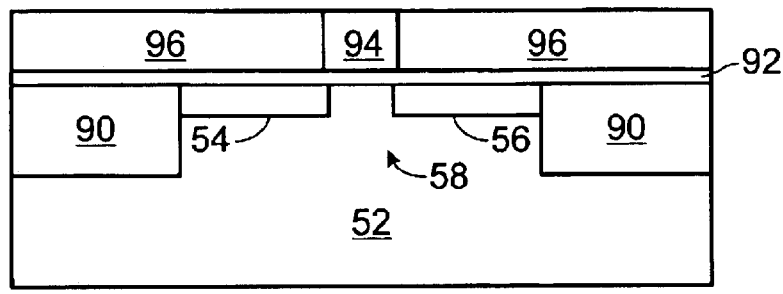

Referring to FIG. 7, a layer of silicon oxide 96 is deposited to a thickness of between about 200 nm to 1200 nm. The thickness of this oxide layer is preferred to be about two times as thick as that of the gate placeholder. The structure is smoothed by CMP to planarize the silicon oxide layer, stopping at the level of the silicon nitride or polysilicon gate placeholder.

Figure 8:
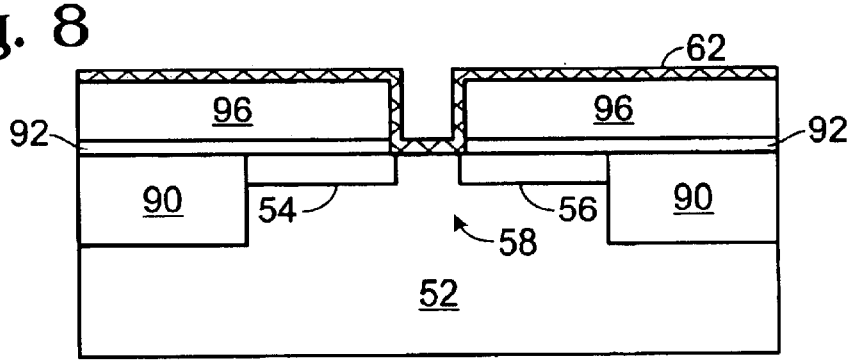

As depicted in FIG. 8, the structure is etched, and the silicon nitride removed to form a gate placeholder structure. The gate placeholder is etched preferably by a wet etch process. The entire structure is etched by BHF to remove the sacrificial gate oxide in the gate region. A gate insulator 62 is deposited. The gate insulator is formed of a high-k insulator, previously described and identified, having a thickness of between about 2 nm to 10 nm. This portion of the high-k material is designated 62L, and is in contact with the silicon substrate, and covers the walls of the gate placeholder structure. 62L is referred to herein as a high-k cup, or high-k lower portion. A layer of ferroelectric thin film, such as PGO, PZT, BTO, SBTO, or SBTN, is deposited to fill the void of the removed gate placeholder. The ferroelectric material fills the "cup" formed by 62L.

Figure 9:
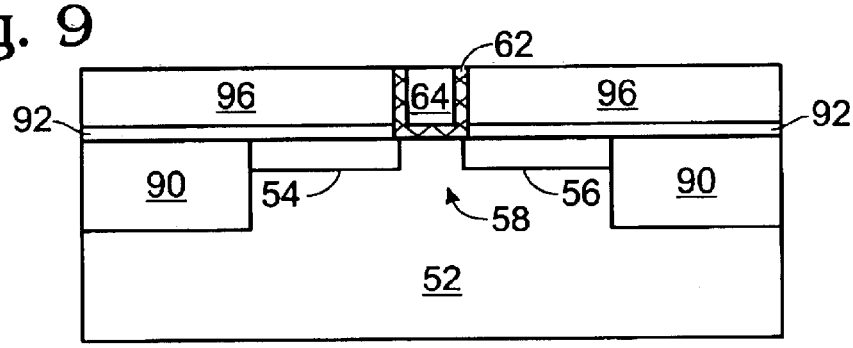

Referring to FIG. 9, the ferroelectric layer is smoothed, stopping at the level of silicon oxide layer. The smoothing may be accomplished by chemical mechanical polishing (CMP) or by any well-known planar etchback process. Another portion of the high-k insulator, 62U, referred to herein as a high-k upper portion or high-k cap, is deposited by CVD to a thickness of between about 2 nm to 10 nm. The selected high-k material has low leakage current properties. Top electrode 66 is formed of a material such as aluminum, copper, platinum or iridium.

Figure 10:
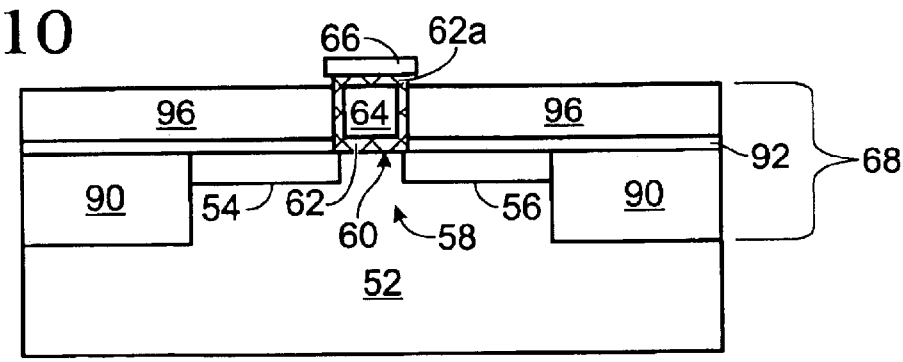

Turning to FIG. 10, top electrode 66 and high-k layer 66U are etched to form a control gate electrode and gate stack 60. A layer of passivation oxide 98 is deposited by CVD, the structure is etches to form contact vias and is metalized, resulting in the structure depicted in FIG. 4.

Thus, a method and system for fabricating a ferroelectric memory transistor having long memory retention characteristics has been disclosed. It will be appreciated that further variations and modifications thereof may be made within the scope of the invention as defined in the appended claims.

We claim:

1. A ferroelectric memory transistor comprising:

A substrate having active regions therein;

a gate stack, including:
      a high-k insulator element, including a high-k cup and a high-k cap;
      a ferroelectric element, wherein said ferroelectric element is encapsulated within said high-k insulator element; and
      a top electrode located on a top portion of said high-k insulator;

a passivation oxide layer located over the substrate and gate stack; and metalizations to form contacts to the active regions and the gate stack.

2. The ferroelectric memory transistor of claim 1 wherein said high-k insulator element is formed of a material taken from the group of materials consisting of $HfO_2$, $ZrO_2$ and $HfZrO_X$.

3. The ferroelectric memory transistor of claim 1 wherein said high-k insulator element has a thickness of between about 2 nm to 10 nm.

4. The ferroelectric memory transistor of claim 1 wherein said ferroelectric element is formed of a material taken from the group of materials consisting of PGO, PZT, BTO, SBTO, and SBTN.

5. The ferroelectric memory transistor of claim 1 wherein said ferroelectric element has a thickness of between about 98 nm to 598 nm.

6. The ferroelectric memory transistor of claim 1 wherein said top electrode is formed of a material taken from the group of materials consisting of copper, aluminum, iridium and platinum.

* * * * *